(12) United States Patent
Satoh

(10) Patent No.: US 8,035,080 B2
(45) Date of Patent: Oct. 11, 2011

(54) METHOD AND SYSTEM FOR INCREASING BEAM CURRENT ABOVE A MAXIMUM ENERGY FOR A CHARGE STATE

(75) Inventor: Shu Satoh, Byfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 187 days.

(21) Appl. No.: 12/609,912

(22) Filed: Oct. 30, 2009

(65) Prior Publication Data

US 2011/0101213 A1    May 5, 2011

(51) Int. Cl.
*H01J 37/08* (2006.01)
*B01D 59/44* (2006.01)

(52) U.S. Cl. .................... 250/282; 250/492.21
(58) Field of Classification Search .................. 250/281, 250/282, 398, 492.1, 492.2, 492.21, 492.3
See application file for complete search history.

(56) References Cited

U.S. PATENT DOCUMENTS

| | | | |
|---|---|---|---|
| 5,760,409 A * | 6/1998 | Chen et al. | 250/492.21 |
| 5,783,823 A * | 7/1998 | Mous et al. | 250/281 |
| 6,208,095 B1 | 3/2001 | DiVergilio et al. | |
| 6,242,747 B1 | 6/2001 | Sugitani et al. | |
| 6,414,327 B1 | 7/2002 | Klinkowstein et al. | |
| 6,462,331 B1 | 10/2002 | Choi et al. | |
| 6,815,666 B2 | 11/2004 | Schroeder et al. | |
| 7,439,498 B2 * | 10/2008 | Litherland et al. | 250/288 |
| 2006/0011866 A1 | 1/2006 | Cho | |
| 2009/0272910 A1 * | 11/2009 | Grynyov et al. | 250/390.11 |

* cited by examiner

*Primary Examiner* — Bernard E Souw
(74) *Attorney, Agent, or Firm* — Eschweiler & Associates, LLC

(57) ABSTRACT

Methods and a system of an ion implantation system are disclosed that are capable of increasing beam current above a maximum kinetic energy of a first charge state from an ion source without changing the charge state at the ion source. Positive ions having a first positive charge state are selected into an accelerator. The positive ions of the first positive charge state are accelerated in acceleration stages and stripped to convert them to positive ions of a second charge state. A second kinetic energy level higher than the maximum kinetic energy level of the first charge state can be obtained.

20 Claims, 5 Drawing Sheets

METHOD AND SYSTEM FOR INCREASING BEAM CURRENT ABOVE A MAXIMUM ENERGY FOR A CHARGE STATE

FIELD

The present disclosure relates generally to ion implantation systems, and more particularly to a system and method for increasing beam current available at a maximum energy for a charge state without using a higher charge state at an ion source.

BACKGROUND

Ion implantation is a physical process, as opposed to diffusion, which is a chemical process that is employed in semiconductor apparatus fabrication to selectively implant dopant into a semiconductor workpiece and/or wafer material. Thus, the act of implanting does not rely on a chemical interaction between a dopant and the semiconductor material. For ion implantation, dopant atoms/molecules are ionized and isolated, sometimes accelerated or decelerated, formed into a beam, and swept across a workpiece or wafer. The dopant ions physically bombard the workpiece, enter the surface and typically come to rest below the workpiece surface in the crystalline lattice structure thereof.

In RF based accelerators and DC based accelerators, ions can be repeatedly accelerated through multiple acceleration stages of an accelerator. For example, RF based accelerators can have voltage driven acceleration gaps. Due to the time varying nature of RF acceleration fields and the multiple numbers of acceleration gaps there are a large number of parameters, which influence the final beam energy. Because the charge state distribution of an ion beam can change, substantial effort is paid to keep the charge value in the ion beam at the initially intended single value. However, greater demands for an implantation recipe (e.g., ion beam energy, mass, charge value, beam current and/or total dose level of the implantation) at a higher energy level call for providing a higher beam current without compromising the ion source unnecessarily.

Accordingly, suitable systems or methods for increasing beam current are desired.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to the more detailed description that is presented later.

According to one or more embodiments, a system and method increase beam current available at a maximum kinetic energy for a charge state without using a higher or different charge state at an ion source. For example, an ion source of an ion implantation system can comprise ions (e.g., Boron or phosphorus ions) of a particular charge state (e.g., $B^{++}$) for generating an ion beam therefrom. Processes within the ion implantation system (such as within an accelerator located along a beam path) can act to cause ions to change their initial charge value (e.g., a charge exchange reaction). For example, in one embodiment, a boron ion comprising a net positive charge of two can be selected into the accelerator and stripped of electrons by a charge stripper comprising a gas source and a turbo pump. In one embodiment, the accelerator can comprise a number of accelerator stages and a charge stripper therein. When a high speed ion comes in close proximity to another molecule or atom of a gas within the charge stripper, the ion may pick up an electron from the molecule or atom (i.e., an electron "picking up" reaction), or may loose an electron to the molecule or atom (i.e., a charge stripping reaction). The former reaction reduces the value of ion charge by one; for example, a singly charged ion can become a neutral, that is, an electrically neutral atom. The latter increases the value of ion charge by one (e.g., a singly charged ion becomes a doubly charged ion).

In one embodiment, positive ions (e.g., Boron ions) comprising a first positive charge state (e.g., +2 net positive charge or valence) are drawn into an accelerator comprising a charge stripper and a plurality of acceleration stages. The respective acceleration stages may comprise RF resonators for generating RF accelerating fields to accelerate ions along a beam path. The charge stripper can comprise a gas source for emitting a gas into the accelerator and a turbo pump for creating a vacuum to exit the gas and prevent gas flow into acceleration stages. The charge stripper can replace one of the acceleration stages within the accelerator in order to strip ions of an electron, and thus, cause the positive ions entering the accelerator to convert to positive ions of a second charge state exiting the accelerator. While the second charge state of the ions exiting the charge stripper of the accelerator may be greater than the first positive charge state of the ions selected to enter the accelerator, the opposite may also occur, where the second charge state may be less than the first positive charge state.

In one embodiment, an accelerator of an ion implantation system comprises a plurality of accelerator stages before and after a charge stripper located therein. As positive charged ions of an ion beam can be selected into the accelerator and accelerated, a more positive ion of a different charge state can be increased in concentration therein and accelerated out of the accelerator for ion implantation. For example, a charge stripper can replace an acceleration stage within the accelerator to strip electrons from ions within a middle section of the accelerator and then accelerate the ions out that are of a different charge. Therefore, a concentration of ions with a first positive charge state that are entering the accelerator is of a less concentration when exiting the accelerator.

To the accomplishment of the foregoing and related ends, the disclosure comprises the features hereinafter fully described and particularly pointed out in the claims. The following description and the annexed drawings set forth in detail certain illustrative aspects of the disclosure. These aspects are indicative, however, of but a few of the various ways in which the principles of the disclosure may be employed. Other aspects, advantages and novel features of the disclosure will become apparent from the following detailed description of the disclosure when considered in conjunction with the drawings.

DETAILED DESCRIPTION

Figure 1:
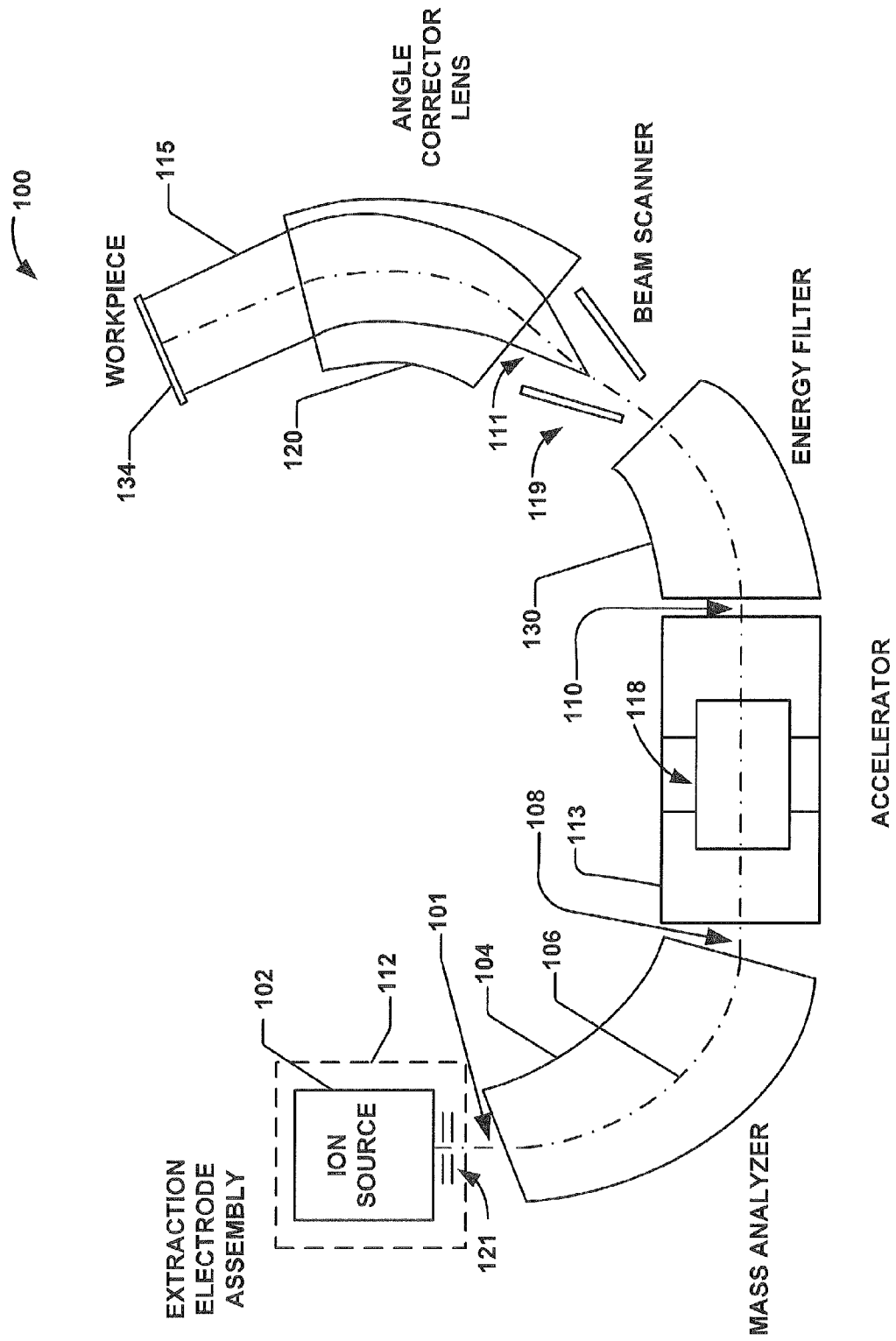
FIG. 1 is a simplified top view illustrating an ion implantation system in accordance with an aspect of the present disclosure.

The present disclosure will now be described with reference to the drawings wherein like reference numerals are used to refer to like elements throughout.

For an ion of a charge state value (q), final ion energy is linearly dependent upon the charge state of the ion. The final energy (Efinal) of an ion beam, for example, for an electrostatic acceleration implantation system can be given by:

$$E\text{final}=q*(V\text{ext}+V\text{acc}), \quad (1)$$

where Vext is an extraction voltage at an ion source and Vacc is a post acceleration voltage. For an RF acceleration system, the final energy of an ion beam exiting at an accelerator output can be given by:

$$E\text{final}=q*(V\text{ext}+(N*V\text{st})), \quad (2)$$

where Vst represents an average energy gain/accelerator stage, and (N) represents a number of RF resonators within an accelerator, which the ion beam is accelerated through. For example, Vext is limited to less than 100 KV for reliable operations. Values for a practical maximum of Vacc can be about 1 MV, N can be about 10 or more, and Vst can be between 100 to 150 KV. Thus, the final energy (Efinal) for a charge state of q=1 can be about equal to or less 1500 KeV.

In order to increase the final energy (Efinal) without changing the charge state at the ion source, the parameters (N), (Vacc) and/or (q) of the equations can be increased. Increasing Vacc or N can be very costly, and thus, the present disclosure increases the charge value (q) to a charge state value of equal to or greater than 2 (as with multi-charged ions) as one way to obtain a higher energy level than the energy level of ions at q=1. In addition, the amount of ions available from an ion source decreases almost exponentially as charge state goes up (e.g., greater than a factor of ten for each increase in charge state). For example, 3 MeV of ion energy can only be available through the use of a higher charge state (e.g., $3^{+++}$) at the ion source. However, because of the exponential decrease of higher charge state ions at the source, ion beam current available at this energy level is very limited or the ion source would need to be pushed very hard, which would shorten the source life to unacceptable levels for industrial applications.

In order to avoid pushing an ion source excessively to generate higher energy ions, and thereby shortening the ion source's lifespan, a method and system is desired to operate under normal conditions, but still increase beam current above energy levels of ions with a lower charge state generated by the ion source. For example, if a high velocity particle or ion goes through a layer of atoms (e.g., a thin foil or thin layer of gas, as in a charge stripper device) the particle may lose some extra electrons or gain its electrons (i.e., as by charge exchange reactions) depending on the particle velocity. Thus, such charge exchange reactions between an ion beam and the layer of atoms (e.g., a thin layer of introduced gas, or thin foil) can change the various ions' charge state from an initial value provided in a recipe to another charge state (e.g., $B^+$ to $B^{++}$, or $B^{++}$ to $B^+$).

Higher charged (stripped) ions can gain more energy than non-stripped ions due to the higher charge state. For ion beams of energies greater than 1 MeV, for example, the particle velocity can be high enough to provide a high probability of charge stripping reactions occurring (e.g., a particle loses electrons to become a higher net charge state) and ensure a sufficient charge stripping efficiency. Additionally, because the amount of low charge state ions is more abundant than the high charge state, more of the ion beam can be pushed into a charge stripper. Thus, in one aspect of the disclosure, by placing a charge stripper at a location in an accelerator where ion energy is high enough to give an adequate stripping efficiency for the desired charge state higher than the amount obtained at the ion source, an increase in the beam current can be obtained at an energy range higher than obtained with lower charged ions.

Referring now to the figures, in accordance with one exemplary aspect of the present disclosure, FIG. 1 illustrates a hybrid parallel scan single wafer ion implantation system 100. The implantation system 100 is also referred to as a post acceleration implanter, since a main accelerator 113 is placed after a mass analyzer 104 analyzing an ion beam 106 and before an energy filter 130. Ion implanters of this type often have the energy filter 130 after the accelerator 113 to remove unwanted energy spectrum in the output of accelerator 113. In one embodiment, an ion beam 101 generated from an ion source 102 may be accelerated by an accelerator in an acceleration stage (not shown) before the mass analyzer 104 to generate an accelerated and/or analyzed ion beam 108, for example. Downstream the accelerated and/or analyzed ion beam 108 may be accelerated again in the accelerator 113 by a plurality of accelerator stages therein. For example, the accelerator stages may comprise resonators (as with an RF accelerator) respectively to generate RF acceleration fields therein and output an exited ion beam 110 that has been further accelerated. After passing through the energy filter 130, the filtered ion beam goes through a beam scanner 119 and then through an angle corrector lens 120 to convert the fanned-out beam 111 into a parallel shifted ion beam 115.

A workpiece and/or substrate 134 is moved orthogonal (shown as moving in and out of the paper) to the ion beam 115 in the hybrid scan scheme to irradiate the entire surface of the workpiece 134 uniformly. As stated above, various aspects of the present disclosure may be implemented in association with any type of ion implantation system, including, but not limited to the exemplary system 100 of FIG. 1.

The exemplary hybrid parallel scan single wafer ion implantation system 100, for example, comprises a source chamber assembly 112, which comprises the ion source 102 and an extraction electrode assembly 121 to extract and accelerate ions to an intermediate energy. A mass analyzer 104 removes unwanted ion mass and charge species and the accelerator assembly 113 accelerates the ions to a final energy. The beam scanner 119 scans a beam exiting from the accelerator assembly 113 back and forth at a fast frequency into the angle corrector lens 120 to convert the fanning out scanned beam 111 from the beam scanner 119 to the parallel shifted beam 115 and the workpiece 134, which can be housed in a process chamber or end station (not shown).

The accelerator assembly 113, for example, can be an RF linear particle accelerator (LINAC) in which ions are accelerated repeatedly by an RF field, or a DC accelerator (e.g., a tandem electrostatic accelerator), which accelerates ions with a stationary DC high voltage. The beam scanner 119, either electrostatically or electromagnetically scans the ion beam 110 left to right into the angle corrector lens 120, which converts the fanning-out beam 111 into the parallel shifted ion beam 115. The angle corrector lens 120 can be an electromagnetic magnet as shown, but there is also an electrostatic version, for example. The final parallel shifted ion beam 115 out of the angle corrector lens 120 is directed onto the workpiece 134.

In one embodiment, the final kinetic energy of ion particles passing through the accelerator 113 can be increased by increasing the ion charge value (q), as illustrated by the equations 1 and 2 above. The ion charge state (q) can be increased in one embodiment by providing a charge stripper 118 within the accelerator 113. For example, in an RF accelerator a number of accelerator stages (e.g., six or more) can comprise resonators for generating an accelerating field (not shown), and at least one of the accelerator stages can comprise the charge stripper 118, which can replace the resonator(s) at that stage.

In one embodiment, acceleration of the ion beam can occur before the charge stripper 118 located within the accelerator 113, for example, through a first plurality of acceleration stages within the accelerator 113. Acceleration can also occur after the charger stripper 118, for example, through a second plurality of acceleration stages within the accelerator 113. Alternatively, the first plurality of acceleration stages may be external to the accelerator 113. For example, the first plurality of acceleration stages can be located before the mass analyzer, and thus, the ion beam 108 is both an accelerated and analyzed ion beam 108 entering the charge stripper 118.

In one embodiment, the ion beam 108 comprises positive ions comprising a first charge state (e.g., $B^{++}$) where the net electrical charge of the ions can be positive. After entering the charge stripper 118, a fraction of the positive ions of the first charge state can be converted into positive ions of a second charge state (e.g., $B^{+++}$). Consequently, the ion beam 110 exiting the accelerator 113 comprises a lower concentration of the positive ions of the first charge state, a concentration of ions of the second charge state, and an increase in beam current that is above the kinetic maximum energy level available using the first charge state. The ion beam can comprise any number of beam species, such as Boron, Phosphorus, and/or Arsenic, for example.

Figure 2:
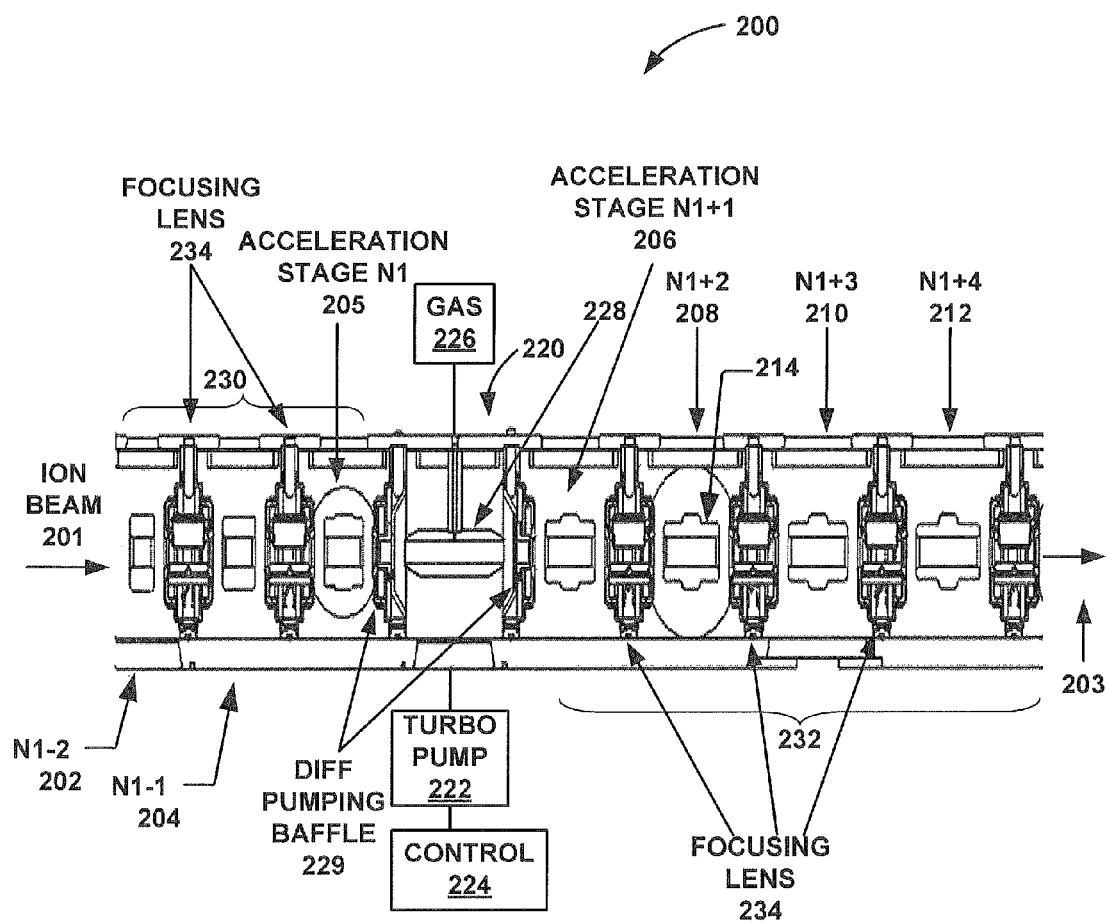
FIG. 2 is a portion of an ion implantation system according to at least one aspect of the present disclosure.

FIG. 2 illustrates one example of a portion of an ion implantation system in accordance with one aspect of the disclosure. An accelerator 200 can comprise at least one of a first plurality of accelerator stages 230, for example, and at least one of a second plurality of accelerator stages 232. For example, the accelerator 200 can comprise an RF accelerator, which is illustrated in FIG. 2 as one example of an embodiment, and can comprise any number of accelerator stages (e.g., 202, 204, 205, 206, 208, 210, and 212). The accelerator stages 202, 204, 205, 206, 208, 210, and 212 can respectively comprise at least one accelerator electrode 214 which is driven by an RF resonator, for example, for generating a RF accelerating field on both sides (not shown). An ion beam 201 of charged particles with a charge state (e.g., a net electrical charge or a valence) can pass through apertures of the accelerator electrode in succession. The principles of acceleration are well known in the art.

Beam focusing can be provided by lenses 234 (e.g., electrostatic quadrupole) incorporated within the accelerator 200. In one embodiment, the accelerator 200 can accelerate singly-charged Phosphorus ions to a maximum kinetic energy level (e.g., up to about 1.2 MeV) for a first charge state, and/or singly-charged Boron ions to a maximum kinetic energy level (e.g., up to about 1.5 MeV) for a first charge state. In one embodiment, ions of a higher second charge state can be employed to reach higher energy levels than the maximum kinetic energy level for a lower first charge state. Thus, the ion beam 201 comprising ions of the first charge state can enter the accelerator 200 as an entering beam and be converted to ions of a second charge state of a higher or lower net charge valence. By removing electrons therein, as by a charge stripper 220 incorporated within the accelerator 200, the entering beam 201 can be converted to an exiting beam 203 comprising ions of the second higher charge state (e.g., B+ converted to B++, or $B^{++}$ converted to $B^{+++}$), thereby increasing beam energy beyond the maximum kinetic energy level for the first charge state.

Once the ion beam 201 has been extracted and formed, the beam 201 may be accelerated by the accelerator 200 (e.g., a 13.56 MHz twelve resonator RF linear accelerator). There is no one particular accelerator or type of linac that the present disclosure is confined to. In one embodiment, the accelerator 200 can comprise a first plurality of accelerator stages 230 integrated in the accelerator 200 for accelerating the ion beam 201 therein and a second plurality of accelerator stages 232 integrated in the accelerator 200 for further acceleration of ions in the ion beam 203 therein. While the first plurality of accelerator stages are integrated in the accelerator 200 and upstream of the charge stripper 220 in the illustrated example of FIG. 2, the first plurality of accelerator stages 230 may be located before a mass analyzer (e.g., mass analyzer 104 of FIG. 1). Thus, the charge stripper 220 can be located at any of the acceleration stages of the accelerator 200 as long as the first plurality of accelerator stages provide enough energy to the ions of first charge state, high enough to guarantee a high stripping efficiency for the production of the second charge state, greater than the amount available at the ion source. For example, resonators of an RF accelerator can be replaced at any acceleration stage with the charge stripper 220. In one embodiment, for example, the charge stripper 220 can be located downstream of at least one of the first plurality of accelerator stages 230 of the accelerator in a direction of the ion beam 201, and upstream of at least one of the second plurality of accelerator stages 232 of the accelerator 200. In other embodiments, for example, the first plurality of accelerator stages of the accelerator can comprise more or less accelerator stages than the second plurality of accelerator stages. Alternatively, the first plurality of accelerator stages of the accelerator can comprise an equal number of accelerator stages than the second plurality of accelerator stages. The number of stages is not confined to the illustration of FIG. 2.

In a further embodiment, the ion beam 201 entering the accelerator 200 comprises a positive ion beam of the first charge state, and the exiting ion beam 203 comprises a positive ion beam of the second charge state that comprises a more positive charge state than the first charge state. The entering ion beam 201 can enter the charge stripper 220, for example, which comprises of a thin tube filled with a gas, called a stripper tube 228. The charge stripper can also comprise a pump 222 (e.g., a differential turbo pump) for pumping a gas from a gas source 226 to reduce amount of stripper gas flow into adjacent accelerator section. The gas can be any number of gases (e.g., Ar or Xe) for stripping electrons from the ion beam 201 and generating a higher concentration of ions within the ion beam 203 that comprise a higher positive charge state. The charge stripper and/or pump can comprise a control device 224 configured to adjust a flow rate of the gas from the gas source 226 into the charge stripper 220. The flow rate of the gas can be a functionally based on at least one of energy, current, and/or species of the ion beam 201. The charge stripper 220 can further comprise a pumping baffle 229 (e.g., a differential pumping baffle) on both sides of the charge stripper 220. The pumping baffle 228 can function to minimize a gas leak into adjacent accelerator stages (e.g., accelerator stages 205 and 206) together with the differential pump 222.

Figure 3:
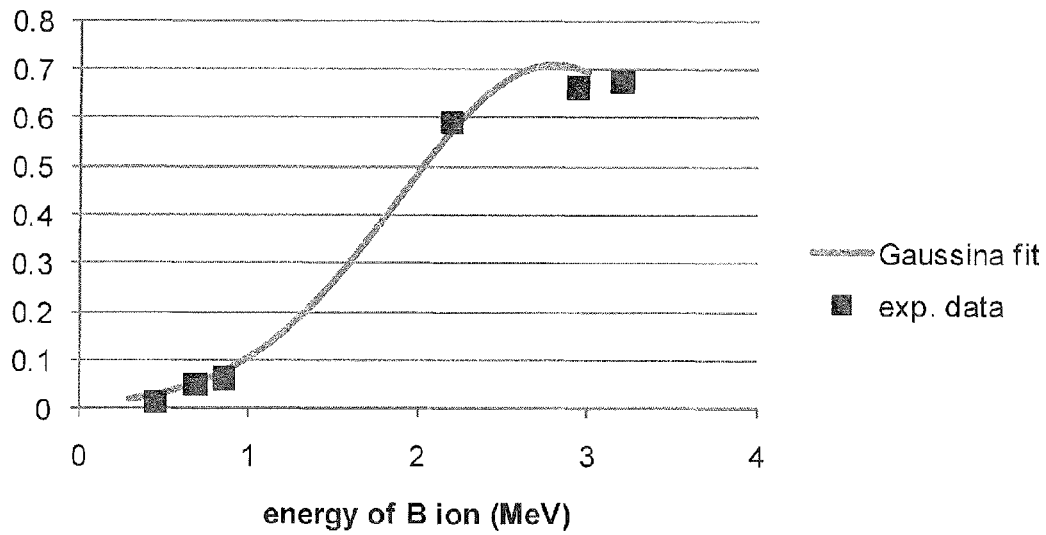
FIG. 3 illustrates a fraction of B+++ after going through a thin layer of Ar gas as a function of boron particle energy.

FIG. 3 illustrates a plot of one example of various aspects and advantages of the present disclosure. FIG. 3 illustrates an example of stripping efficiency to $B^{+++}$ as a function of Boron energy. In one example of the disclosure, Boron can be stripped in the charge stripper 220, as discussed above. Other beam species may also be utilized, such as Phosphorus and/or Arsenic and each species and final charge state have their own stripping efficiency curves peaking at different energies. However, Boron is chosen to be illustrated in FIG. 3 as one example. After an ion beam passes through a charge stripper with a layer of gas or solid therein, the ions of the ion beam are likely to come out with less electrons (e.g., charge stripping) or more electrons (e.g., electron capture), which can be a function of the velocity or energy of the ions. In addition, the higher the velocity of the ions entering the charge stripper, the higher the probability of charge stripping, rather than electron capture. Consequently, a distribution of charge state after passing through a charge stripper is a function of particle/ion energy. FIG. 3 demonstrates an example of these principles as appreciated herein of a fraction of Boron ions with a net positive three charge state after passing through a stripper with Argon gas. However, other gases are also envisioned and may be suitable for such purposes. FIG. 3, therefore, illustrates the strong dependency on Boron energy. For example, an increase in energy above 1 MeV in FIG. 3 demonstrates a correlation with an increase in the fraction or concentration of Boron with a plus three charge stage after stripping in Argon. According to the data shown, as long as $B^{++}$ energy is higher than about 1 MeV, more than 10% of B is converted to $B^{+++}$, which is usually more than $B^{+++}$ available from an ion source.

In one embodiment, acceleration of ions of a first charge state can be performed prior to stripping of the ions in order to obtain a first kinetic energy level that ensures a sufficiently high stripping efficiency so the ion beam after being stripped comprises more positive ions of the second positive charge state than at the ion source to increase beam current at an energy higher than the first kinetic energy level of ions of the first charge state. For example, referring to FIG. 2 again, the location of the charge stripper 220 within the accelerator 200 can be configured to provide more positive ions of the second positive charge state (e.g., ion beam 203) than at the ion source to increase beam current of the ion beam 201 at an energy higher than obtained with positive ions of the first charge state at ion beam 201 and is configured downstream of at least one of a first plurality of accelerator stages 230 of the accelerator 200 in a direction of the ion beam 203, and upstream of at least one of a second plurality of accelerator stages 232 of the accelerator 200.

Figure 4:
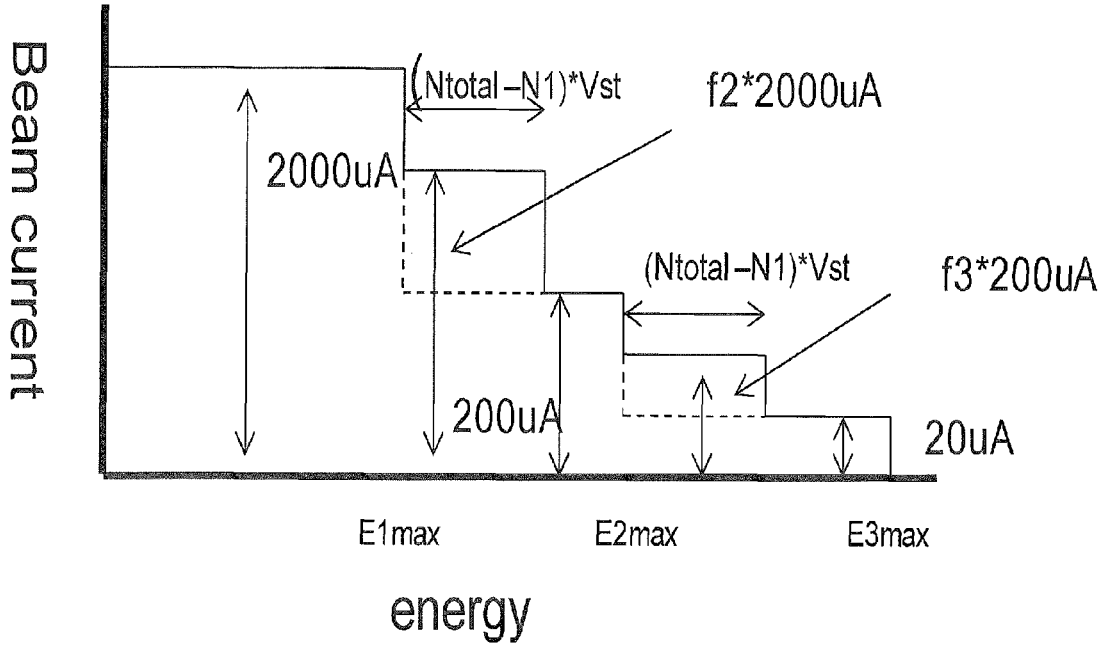
FIG. 4 illustrates an example of a graphical diagram of beam current improvement versus beam energy according to one aspect of the present disclosure.

FIG. 4 illustrates an example of a graphical diagram of beam current improvement versus beam energy according to one aspect of the present disclosure. FIG. 4 is an example of energy versus beam current for an RF machine in particular. The following equation provides the final energy (Efinal) for a DC machine with at least one accelerator stage before a charge stripper:

$$E\text{final} = q1*V\text{ext} + q1*V1 + q2*(V\text{total} - V1), \quad (3)$$

where V1 is a voltage across a front acceleration stage before a charge stripper within the accelerator out of a total (Vtotal) for acceleration.

The following equation provides the Efinal for an RF machine with at least one accelerator stage before the charge stripper:

$$E\text{final} = q1*V\text{ext} + q1*N1*V\text{st} + q2*(N\text{total} - N1)*V\text{st}, \quad (4)$$

where N1 is a number of RF acceleration stages before a charge stripper out of a total of RF acceleration stages (Ntotal). E1max of FIG. 4 represents the maximum energy for ions in a first charge state (e.g., q=1), E2max and E3max are thus representative of maximum energies for subsequent higher charge states. Each step represents a typical factor of 10 decrease in the number of ions available at the output of ion source as charge state goes up, (e.g., 2000 puA for a 1+ charge state, 200 puA for a 2+ charge state, and 20 puA for a 3+ charge state). As demonstrated above with regard to FIG. 3, stripping efficiency or the charge fraction (e.g., f2 for B++, and f3 for B+++ ions) is a function of energy. When enough stripping occurs after ions acquire enough energy (e.g., above 0.1 as illustrated in FIG. 3), the beam current can be increased from the dotted step-sections of FIG. 4 to the solid lined step-sections of the graph.

Figure 5:
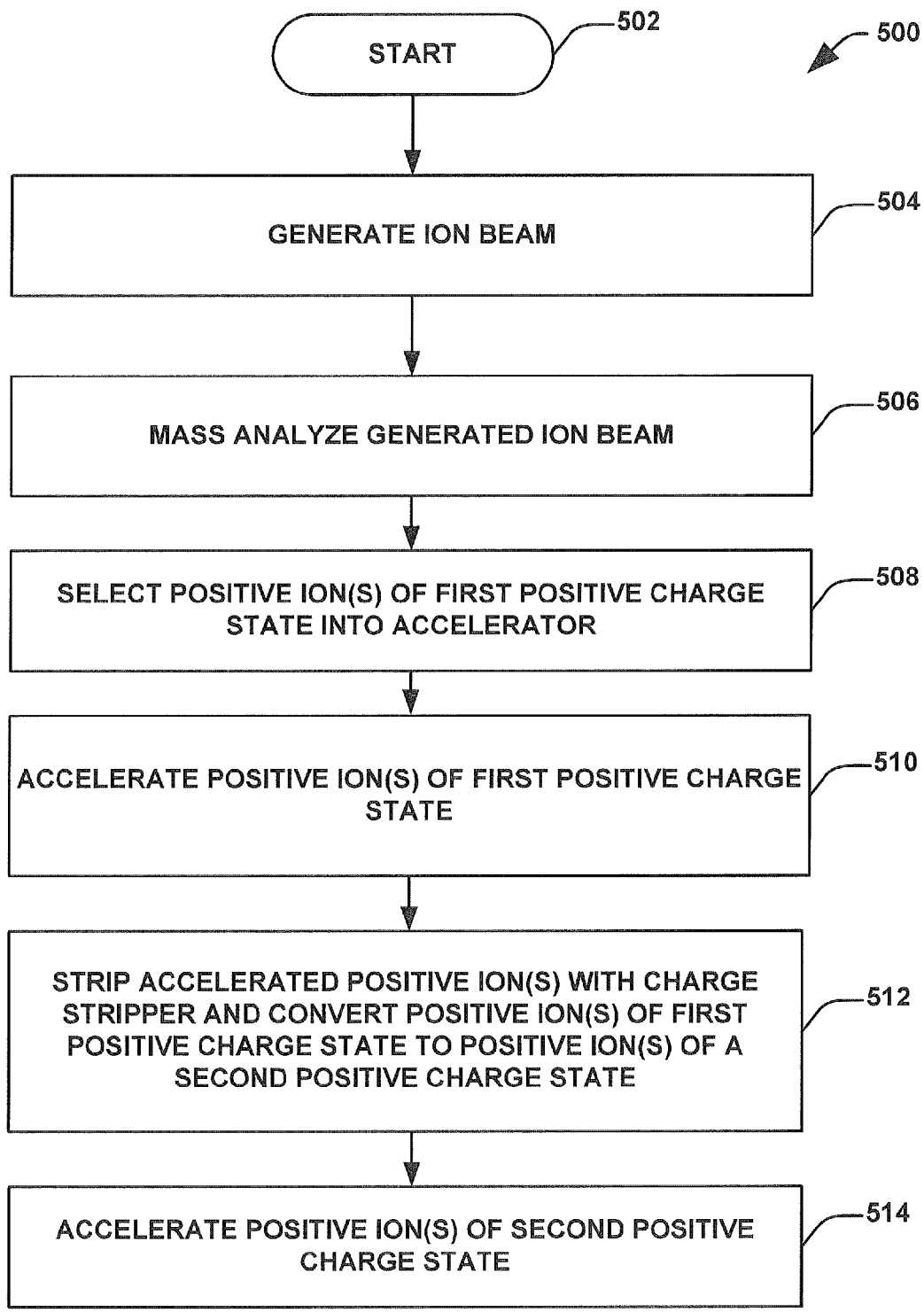
FIG. 5 is a flow chart diagram illustrating a method of increasing beam current according to yet another embodiment of the present disclosure.
Figure 6:
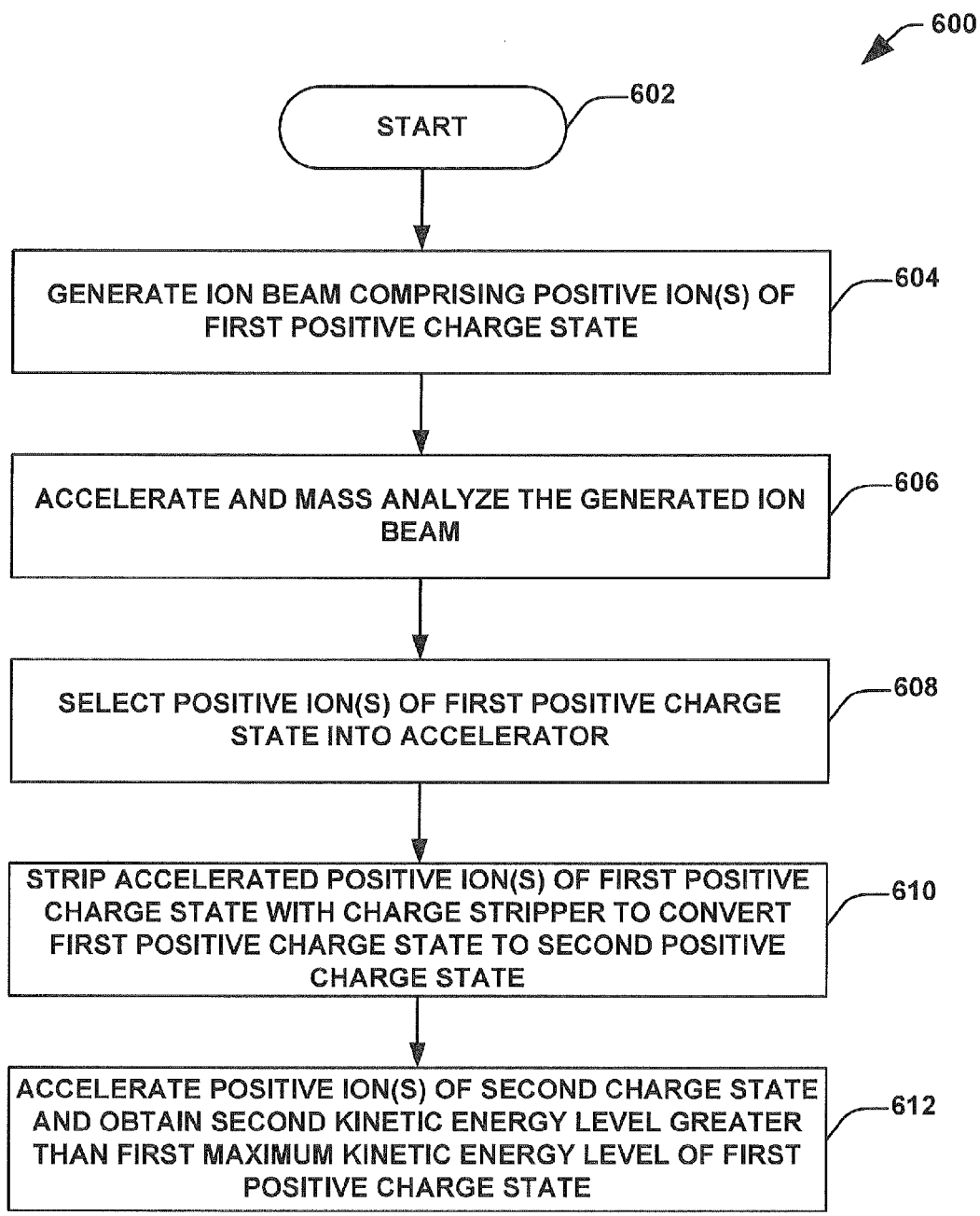
FIG. 6 is a flow chart diagram illustrating a method of increasing beam current according to yet another embodiment of the present disclosure.

Referring now to FIG. 5 and FIG. 6 it should also be noted that while an exemplary method(s) 500 and 600 are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the system 100 and 200 illustrated and described herein as well as in association with other systems not illustrated.

The method 500 of FIG. 5 initiates at 502. An ion source generates an ion beam 504 and directs the beam into a mass analyzer. At 506 the ion beam generated is mass analyzed. The magnetic field strength for the mass analyzer can be selected according to a charge-to-mass ratio. The mass analyzing can be downstream of the ion source, in one example.

Downstream of the mass analyzer and prior to striking a workpiece, positive ion(s) of first positive charge state(s) can be selected 508 to enter into an accelerator. At 510 the selected positive ion(s) of first positive charge state(s) are accelerated to an energy, which yields a higher stripping efficiency to a higher charge state than available at ion source. The accelerated positive ion(s) of first positive charge state(s) enter a stripping canal of a charge stripper, for example, and at 512 these ions are stripped and converted to positives ion(s) of second positive charge state(s). Positive ion(s) of second positive charge state(s) are accelerated at 514.

The method 600 of FIG. 6 initiates at 602. An ion source generates an ion beam comprising positive ions of a first positive charge state (e.g., $B^{++}$). The ion beam can be of various beam species (e.g., Phosphorus, Boron, and Arsenic). At 606 the generated ion beam can be accelerated and mass analyzed in no specific order. At 608 positive ions comprising the first positive charge stated can be selected into an accelerator. At 610 the positive ions may be further accelerated and stripped of electrons to convert them to positive ions of a second positive charge state (e.g., $B^{+++}$). At 612 positive ions of the second positive charge state can be accelerated, and a second kinetic energy level greater than a first maximum kinetic energy level of the first positive charge state can be obtained.

In one embodiment, the positive ions of the ion beam can be accelerated after mass analyzing instead of before. Thus, a first acceleration stage can comprise a first plurality of accelerator stages and a second acceleration stage can comprise a second plurality of accelerator stages. In between the first plurality of accelerator stages and the second plurality of accelerator stages can be located a charge stripper for stripping positive ions of electrons. In one embodiment, the first acceleration stage comprises more acceleration stages than the second acceleration stage comprises. Alternatively, the first acceleration stage can comprise less acceleration stages than the second acceleration stage comprises, or the first acceleration stage and the second acceleration stage can comprise an equal number of acceleration stages respectively.

In one embodiment, the stripping can be performed at one of the acceleration stages of the first plurality of acceleration stages or of the second plurality of acceleration stages. In one embodiment, the methods 500 and/or 600 discussed above can comprise operably coupling the charge stripper to at least one of the accelerator stages and converting the positive ions at a first location and then operably coupling the charge stripper to at least one different accelerator stage and converting the positive ions at a second location. The stripping can therefore be dynamically located at various acceleration stages depending on the recipe of the implantation.

In one embodiment, the methods 500 and 600 can comprise selectively adjusting a flow rate of an exchange gas into the charge stripper of the accelerator with a turbo pump coupled thereto based on at least one of energy, current and species of the ion beam. This can be provided for with a control device, for example, configured to receive measurements of the flow rate and/or ion beam to control the rate of the exchange gas supplied to the charge stripper.

Although the disclosure has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the disclosure.

In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. A method of operating a high energy ion implanter comprising:
   generating an ion beam of a beam species from an ion source;
   mass analyzing the generated ion beam;
   selecting positive ions of a first positive charge state into an accelerator;
   accelerating the positive ions of the first positive charge state through at least one of a first plurality of accelerator stages located within the accelerator to a first kinetic energy level;
   stripping the accelerated positive ions with a charge stripper located within the accelerator, thereby converting the positive ions of the first positive charge state to positive ions of a second positive charge state, wherein the first positive charge state is different from the second positive charge state and wherein stripping is performed with a stripping efficiency that is based upon the first kinetic energy level and provides more positive ions of the second positive charge state than at the ion source to increase beam current at a second energy higher than the first kinetic energy level obtained with positive ions of the first charge state; and
   accelerating the positive ions of the second positive charge state through at least one of a second plurality of accelerator stages located within the accelerator.

2. The method of claim 1, comprising supplying a gas within the charge stripper for stripping an electron from respective positive ions of the first positive charge state to convert the positive ions of the first positive charge state to positive ions of the second positive charge state, and adjusting a flow rate of the gas into the charge stripper of the accelerator based on at least one of energy, current and/or species of the ion beam.

3. The method of claim 1, wherein accelerator stages of the first plurality and the second plurality of accelerator stages respectively comprise at least one resonator for generating an RF accelerating field to accelerate ions therein.

4. The method of claim 1, wherein the second positive charge state comprises a more positive charge state than the first positive charge state.

5. The method of claim 1, wherein the positive ions from the ion source are accelerated through at least ten accelerator stages of the accelerator comprising the first plurality of accelerator stages and the second plurality of accelerator stages, and the accelerator stages respectively comprise at least one resonator.

6. The method of claim 1, wherein the first positive charge state comprises a net charge of +2 and the second positive charge state comprises a net charge of +3; or wherein the first positive charge state comprises a net charge of +1 and the second positive charge state comprises a net charge of +2; and wherein the positive ions drawn into the accelerator comprise positive boron or phosphorus ions of the first positive charge state.

7. The method of claim 1, wherein the charge stripper is located downstream of at least one of the first plurality of accelerator stages of the accelerator in a direction of the ion beam, and upstream of at least one of the second plurality of accelerator stages of the accelerator.

8. The method of claim 1, wherein the first plurality of accelerator stages of the accelerator comprises less accelerator stages than the second plurality of accelerator stages, or wherein the first plurality of accelerator stages comprises an equal number of accelerator stages as the second plurality of accelerator stages.

9. The method of claim 1, wherein the first plurality of accelerator stages of the accelerator comprises more accelerator stages than the second plurality of accelerator stages.

10. The method of claim 1, comprising:
    operably coupling the charge stripper to at least one of the accelerator stages and converting the positive ions at a first location; and
    operably coupling the charge stripper to at least one different accelerator stage and converting the positive ions at a second location.

11. A method of increasing beam current of a high energy ion implanter to above a first maximum kinetic energy level of a first positive charge state without using a second different charge state at an ion source, comprising:
    generating an ion beam comprising positive ions of the first positive charge state and a beam species from the ion source;

accelerating the positive ions of the first positive charge state to a first kinetic energy level through at least one of a plurality of accelerator stages;

mass analyzing the ion beam generated;

selecting the positive ions of the first positive charge state into an accelerator; and stripping the accelerated positive ions of the first positive charge state with a charge stripper, thereby converting the positive ions of the first positive charge state to ions of a second charge state;

wherein stripping is performed with a stripping efficiency that is based upon the first kinetic energy level and provides more positive ions of the second positive charge state than at the ion source to increase beam current at a second energy higher than the first kinetic energy obtained with positive ions of the first charge state.

12. The method of claim 11, wherein the second charge state comprises a more positive charge state than the first positive charge state, and wherein the beam species comprises boron and/or phosphorus.

13. The method of claim 11, wherein the first positive charge state comprises a net charge of +2 and the second positive charge state comprises a net charge of +3; or wherein the first positive charge state comprises a net charge of +1 and the second positive charge state comprises a net charge of +2; and wherein the positive ions selected into the accelerator comprise a concentration of positive ions of the first positive charge state that is greater than any other concentration of ions of any other charge state.

14. The method of claim 11, wherein the charge stripper is located downstream of at least one of a first plurality of accelerator stages of the accelerator in a direction of the ion beam, and upstream of at least one of a second plurality of accelerator stages of the accelerator.

15. The method of claim 11, comprising:

selectively adjusting a flow rate of an exchange gas into the charge stripper of the accelerator with a turbo pump coupled thereto based on at least one of energy, current and species of the ion beam; and accelerating the ions of the second charge state through at least one of a plurality of accelerator stages within the accelerator and obtaining a second kinetic energy level greater than the first maximum kinetic energy level or the first kinetic energy level of the first positive charge state.

16. An ion implantation system, comprising:

an ion beam source configured to generate an ion beam;

a mass analyzer for mass analyzing the generated ion beam;

an accelerator configured to receive the analyzed ion beam, wherein the received ion beam comprises positive ions of a first positive charge state of a beam species, and to exit the ion beam as an exited ion beam comprising a second charge state, the accelerator comprising:

a charge stripper configured to receive the positive ions of the first positive charge state at a location within the accelerator and to convert the positive ions of the first positive charge state to ions of the second charge state; and a plurality of accelerator stages respectively configured to accelerate ions therein; and an endstation located downstream of the accelerator and configured to support a workpiece that is to be implanted with ions of the exited ion beam comprising the second charge state.

17. The system of claim 16, wherein the charge stripper comprises a turbo pump configured to supply a gas for stripping electrons from the positive ions and a control device configured to adjust a flow rate of the gas into the charge stripper of the accelerator based on at least one of energy, current and species of the ion beam.

18. The system of claim 16, wherein the second charge state comprises a more positive charge state than the first positive charge state, and wherein the beam species comprises boron and/or phosphorus.

19. The system of claim 16, wherein the location of the charge stripper is configured to provide more positive ions of the second positive charge state than at the ion source to increase beam current at an energy range higher than obtained with positive ions of the first charge state and is configured downstream of at least one of a first plurality of accelerator stages of the accelerator in a direction of the ion beam, and upstream of at least one of a second plurality of accelerator stages of the accelerator.

20. The system of claim 19, wherein the first positive charge state comprises a net charge of +2 and the second positive charge state comprises a net charge of +3; or wherein the first positive charge state comprises a net charge of +1 and the second positive charge state comprises a net charge of +2; and wherein the positive ions comprise boron and/or phosphorus ions.

* * * * *